(12) United States Patent
Hsu (10) Patent No.: US 9,089,082 B2
(45) Date of Patent: Jul. 21, 2015

(54) PRINTED CIRCUIT BOARD WITH EMBEDDED COMPONENT AND METHOD FOR MANUFACTURING SAME

(71) Applicant: Zhen Ding Technology Co., Ltd., Tayuan, Taoyuan (TW)

(72) Inventor: Shih-Ping Hsu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 28 days.

(21) Appl. No.: 14/109,913

(22) Filed: Dec. 17, 2013

(65) Prior Publication Data
US 2014/0182892 A1 Jul. 3, 2014

(30) Foreign Application Priority Data
Dec. 27, 2012 (CN) .......................... 2012 1 0577714

(51) Int. Cl.
*H05K 1/18* (2006.01)
*H05K 3/46* (2006.01)

(52) U.S. Cl.
CPC .............. *H05K 3/4697* (2013.01); *H05K 1/186* (2013.01); *H05K 3/4602* (2013.01); *H05K 2201/09072* (2013.01); *H05K 2201/10636* (2013.01); *Y10T 29/4913* (2015.01)

(58) Field of Classification Search
CPC ................... H05K 1/183; H05K 1/185–1/188; H05K 3/4697
See application file for complete search history.

(56) References Cited

U.S. PATENT DOCUMENTS 7,287,321 B2 * 10/2007 Takeuchi et al. ................. 29/834
7,732,712 B2 * 6/2010 Yamano ......................... 174/260

FOREIGN PATENT DOCUMENTS

| TW | 200610118 A | 10/2005 |
| TW | 200618208 A | 6/2006 |
| TW | 200922429 A | 5/2009 |

* cited by examiner

*Primary Examiner* — Jeremy C Norris
(74) *Attorney, Agent, or Firm* — Novak Druce Connolly Bove + Quigg LLP (57) ABSTRACT

A printed circuit board with an embedded component includes a double-sided wiring board, an electronic component, and many conductive pastes. The wiring board includes a first wiring layer, a base layer, a first insulating layer, and a second wiring layer. The base layer has an opening exposing a portion of the second surface of the first insulating layer to the outside. The second wiring layer includes electrical contact pads. The conductive blind vias are formed in the first insulating layer. Each electrical contact pad is electrically connected to an end of the corresponding conductive blind via. The other ends of the conductive blind vias are adjacent to the first surface. A filling through hole is formed in the double-sided wiring board. The conductive pastes are respectively electrically connected to the conductive blind vias. The electronic component is adhered to and electrically connected to the conductive paste.

8 Claims, 8 Drawing Sheets

PRINTED CIRCUIT BOARD WITH EMBEDDED COMPONENT AND METHOD FOR MANUFACTURING SAME

BACKGROUND

1. Technical Field

The present disclosure generally relates to printed circuit boards (PCBs), and particularly, relates to a method for making a printed circuit board with embedded component, and a printed circuit board with embedded component made by the method.

2. Description of Related Art

To accommodate the development of multiple function, miniaturized electronic products, printed circuit boards are widely used due to their lightness and high density assembly qualities.

A normal method for making a printed circuit board with an embedded component includes the following steps. Forming a through hole in a wiring board, and forming a insulative or conductive supporting material layer at a side of the wiring board, covering the through hole. Arranging and fixing an electronic component in the through hole on the supporting material layer and laminating a first adhesive layer on a side of the wiring board further away from the supporting material layer, such that one side of the electronic component is adhered on the first adhesive layer. Removing the supporting material layer from the wiring board, and laminating a second adhesive layer on a side of the wiring board further away from the first adhesive layer, such that the other side of the electronic component is adhered on the second adhesive layer. Respectively laminating a first copper layer and a second copper layer on the first adhesive layer and the second adhesive layer, and converting the first copper layer and the second copper layer into a first wiring layer and a second wiring layer. In addition, laser etching a plurality of plated blind holes and electroplating, such that the first wiring layer is electrically connected to the electrodes of the electronic component via the plated blind holes. Forming a solder mask on each first and second wiring layer and embedding a component in a printed circuit board. In the above method, the electronic component is fixed in the supporting material layer first, and then the plated blind holes are formed. In addition, when the electronic component is arranged on the supporting material layer, if an alignment between the electronic component and the plated blind hole is bad, there is need to use an expensive arrangement machine. The cost of the printed circuit board is higher.

What is needed, therefore, is a method for manufacturing a printed circuit board with an embedded component and a printed circuit board with an embedded component to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Embodiments will now be described in detail with reference to the drawings.

FIGS. 1-8 show a method for manufacturing a printed circuit board with an embedded component according to an exemplary embodiment. The method includes the following steps.

Figure 1:
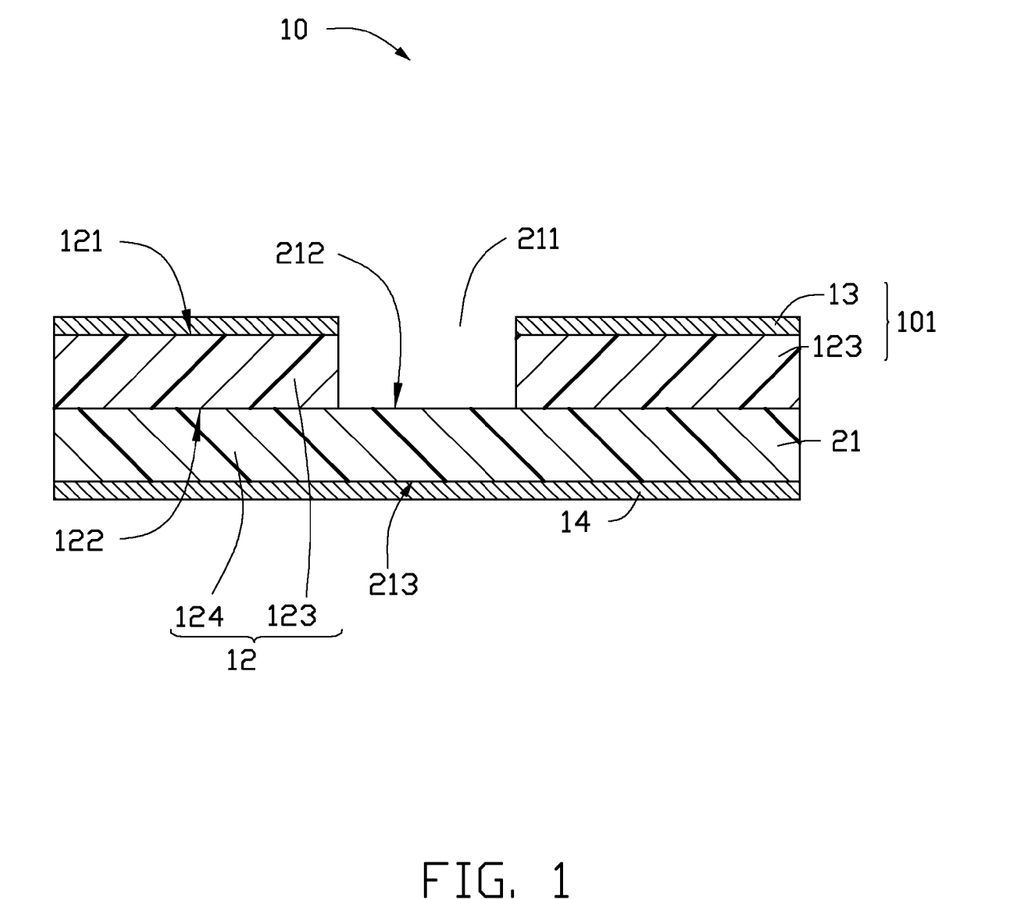
FIG. 1 shows a double-sided copper-clad laminate according to an exemplary embodiment.

FIG. 1 shows that in step 1, a single-sided copper-clad laminate 211 defines an opening 211, a first insulating layer 124, and a second copper foil layer 14 are stacked in a described order, and laminated on each other to obtain a double-sided copper-clad laminate 10.

The single-sided copper-clad laminate 211 includes a base layer 123 and a first copper layer 13. The base layer 123 has an upper surface 121 and a lower surface 122 facing away from the upper surface 121. The first copper layer 13 is formed on the upper surface 121. The first insulating layer 124 is an adhesive sheet, for example, a FR4 epoxy glass cloth semi-cured film. The first insulating layer 124 has a first surface 212 and a second surface 213 facing away from the first surface 212. The first surface 212 contacts with the lower surface 122, and a portion of the first surface 212 is exposed outside the opening 211. The second copper foil layer 14 is attached to the second surface 213. The base layer 123 and the first insulating layer 124 cooperatively constitute a substrate 12.

Figure 2:
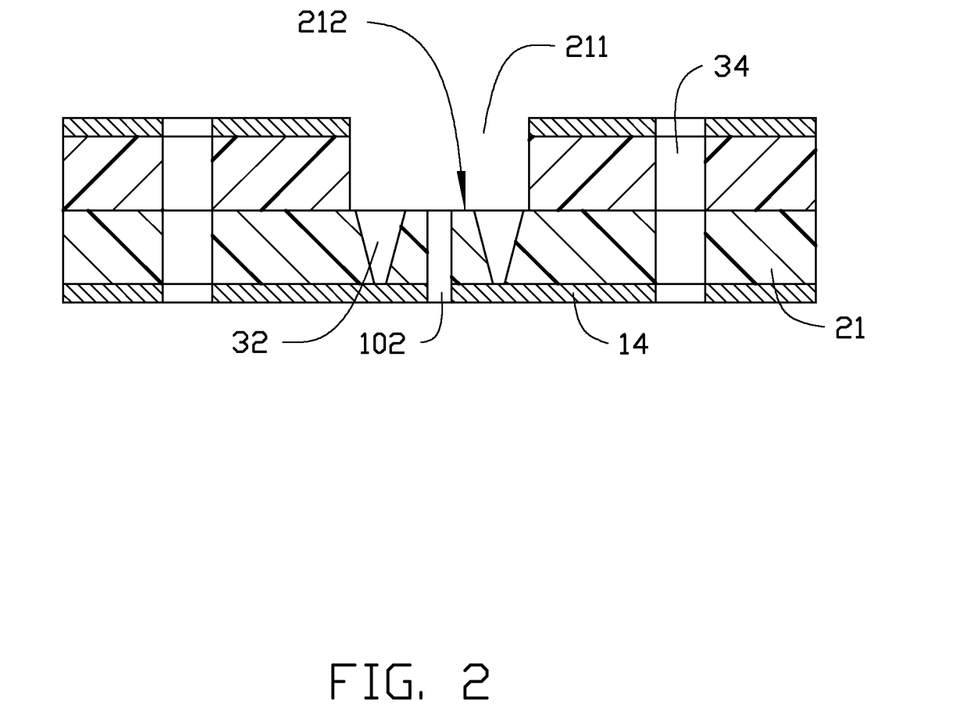
FIG. 2 shows a filling hole and a blind hole formed in the double-sided copper-clad laminate of FIG. 1.
Figure 3:
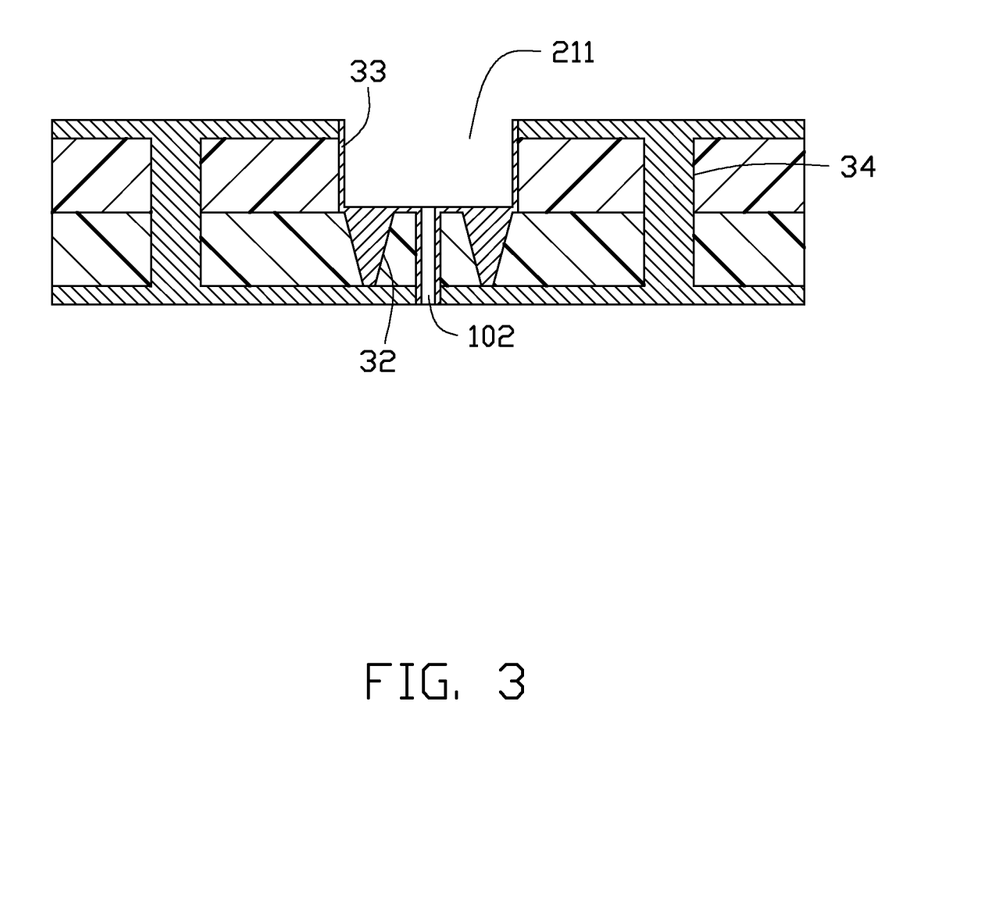
FIG. 3 shows a copper plating layer formed on the double-sided copper-clad laminate of FIG. 2.
Figure 4:
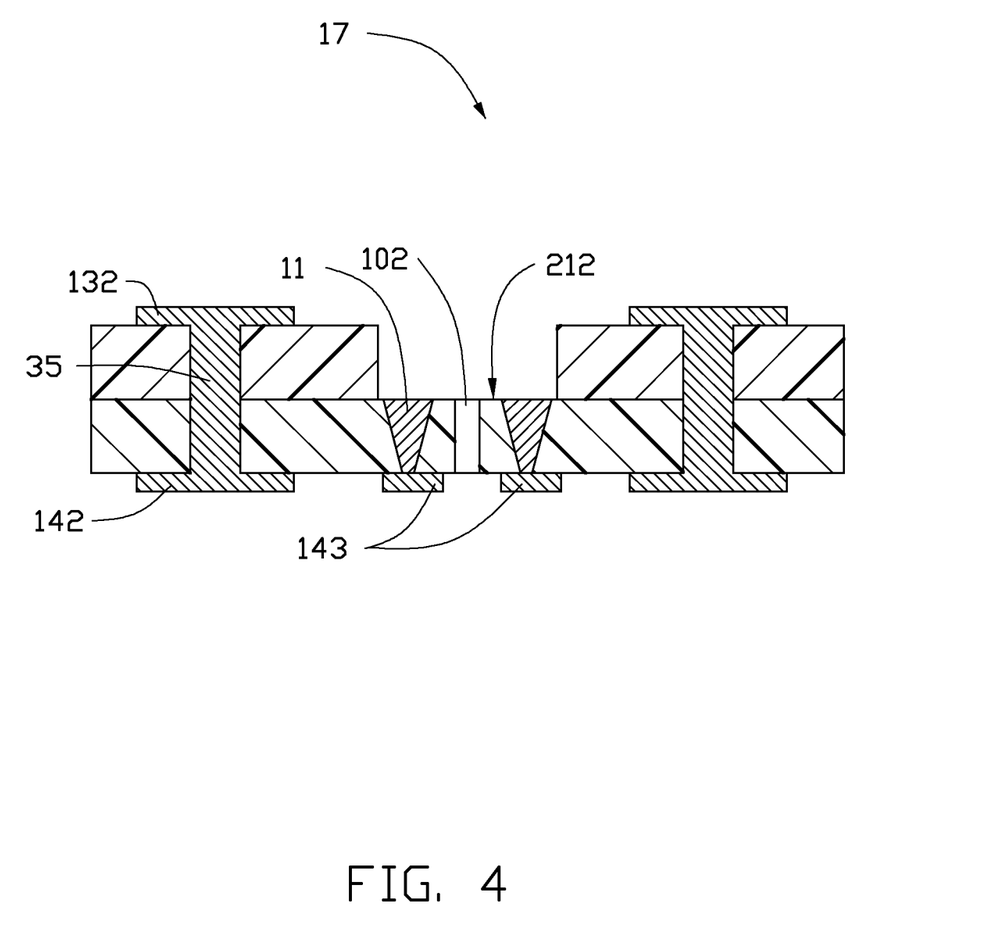
FIG. 4 shows two wiring layers converted by the two copper layers of the double-sided copper-clad laminate of FIG. 3.

FIGS. 2 to 4 show that in step 2, a filling hole 102 passes through the first insulating layer 124 and the second copper foil layer 14, and is formed at the portion of the first surface 212 that is exposed outside from the opening 211. A plurality of blind vias 11 is formed in a portion of the first insulating layer 124 exposed outside from the opening 211. The first copper foil layer 13 and the second copper foil layer 14 are converted into a first wiring layer 132 and a second wiring layer 142, thereby obtaining a double-sided wiring board 17.

The filling hole 102, blind vias 11, the first wiring layer 131, and the second wiring layer 142 are formed in the following steps.

FIG. 2 shows that in the first step, the filling hole 102 passes through the first insulating layer 124 and the second copper foil layer 14, and is formed at the portion of the first surface 212 that is exposed from the opening 211. In addition, the filling hole 102 passes through the portion of the first insulating layer 124 that is exposed outside the opening 211 but does not pass through the second copper foil layer 14, and a plurality of through holes 34, which are passing through the first copper foil layer 13, a base layer 123, the first insulating layer 124, and the second copper foil layer 14.

FIG. 3 shows that in step 2, a copper plating layer 33 is formed on an inner surface of the opening 211, the portion of the first surface 212 in the opening 211, inner surfaces of the blind vias 32, a inner surface of the filling hole 102, and inner surfaces of the through holes 34.

FIG. 4 shows that a portion of the copper plating layer 33 on the inner surface of the opening 211, a part of the first surface 212 on the opening 211, and the inner surface of the filling through hole 102, is removed by using an image transfer process and an etching process, a plurality of plated through holes 35 are formed by reserving portions of the copper plating layer 33 in the filling through holes 34. In addition, a plurality of conductive blind vias 11 are formed by reserving portions of the copper plating layer 33 in the blind vias 32, converting the first copper layer 13 and the second copper layer 14 into the first wiring layer 132 and the second wiring layer 142. In the present embodiment, the conductive blind vias 11, the first wiring layer 132 and the second wiring layer 142 are formed in a same image transfer process and a same etching process. That is, the conductive blind vias 11, the first wiring layer 132 and the second wiring layer 142 are formed at the same time by using the image transfer process and the etching process. The first wiring layer 132 is electrically connected to the second wiring layer 142 via the plated through holes 35.

Figure 5:
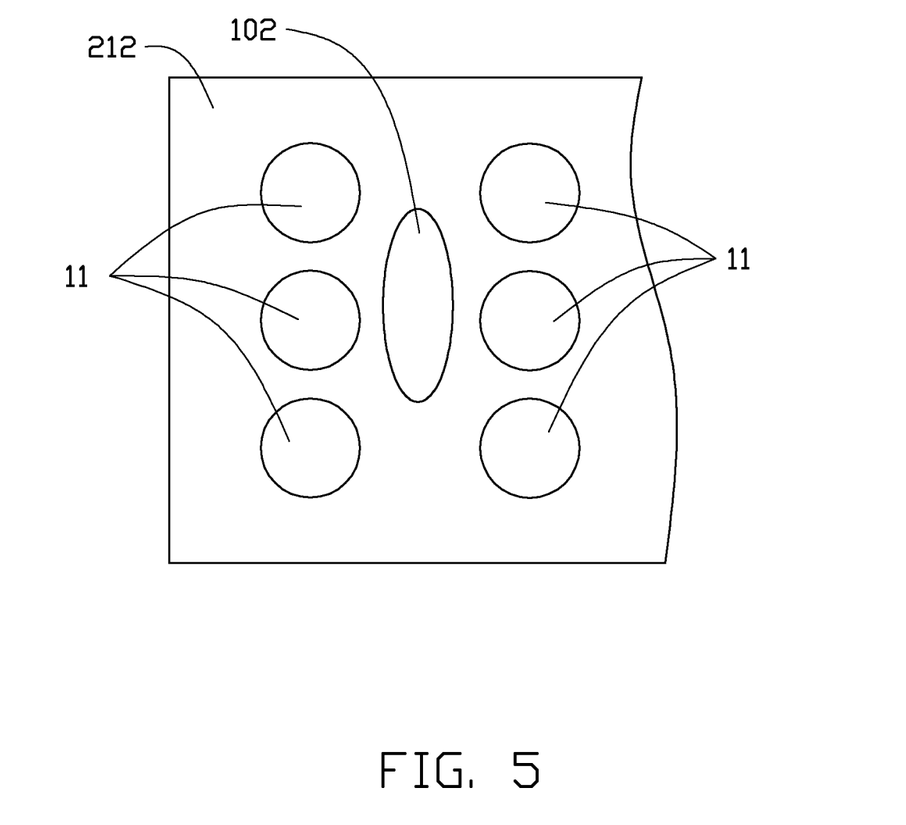
FIGS. 5 and 6 show two double-sided copper-clad laminates of FIG. 4 according to another two embodiments.
Figure 6:
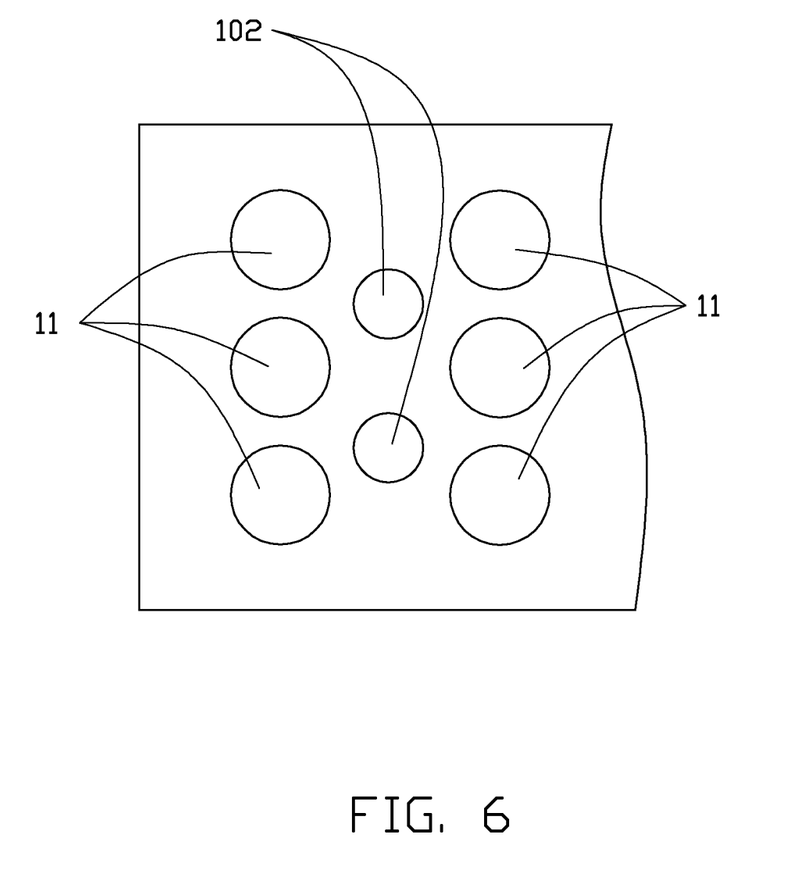

The ends of the filling through hole 102 and the conductive blind vias 11, which are near to the first surface 212, are exposed in the opening 211. The second wiring layer 142 includes a plurality of electrical contact pads 143. In the present embodiment, the number of the electrical contact pads 143 is equal to that of the conductive blind vias 11, and there are six electrical contact pads 143. Each electrical contact pad 143 is electrically connected to a corresponding conductive blind via 11. The end surface of each conductive blind via 11, which is near to the first surface 212, is coplanar with the first surface 212, or is lower than the first surface 212. In the present embodiment, the end surface of each conductive blind via 11, which is near to the first surface 212, is coplanar with the first surface 212. The six conductive blind vias 11 are divided into three couples, and an arrangement of the six conductive blind vias 11 is shown in FIG. 5.

The filling through hole 102 is arranged between two electrical contact pads 143, which corresponds to one pair of the conductive blind vias 11. The filling through hole 102 is configured for a adhesive to pass through to fill a bottom of an electronic component (e.g. an electronic component 16 shown in FIG. 7). The number of the filling through hole 102 may be one (see FIG. 5), and the filling through hole 102 is a oval through hole. There may be two or more filling through holes 102 (see FIG. 6). In other embodiments, a shape of the filling through hole 102 may be other shape, (e.g. polygon, or irregular).

It is understood that the conductive blind vias 11 may be formed by filling a conductive material (e.g. copper paste) into the blind vias 32, and the plating through hole 35 may be formed by filling a conductive material (e.g. copper paste) into the through hole 34.

Figure 7:
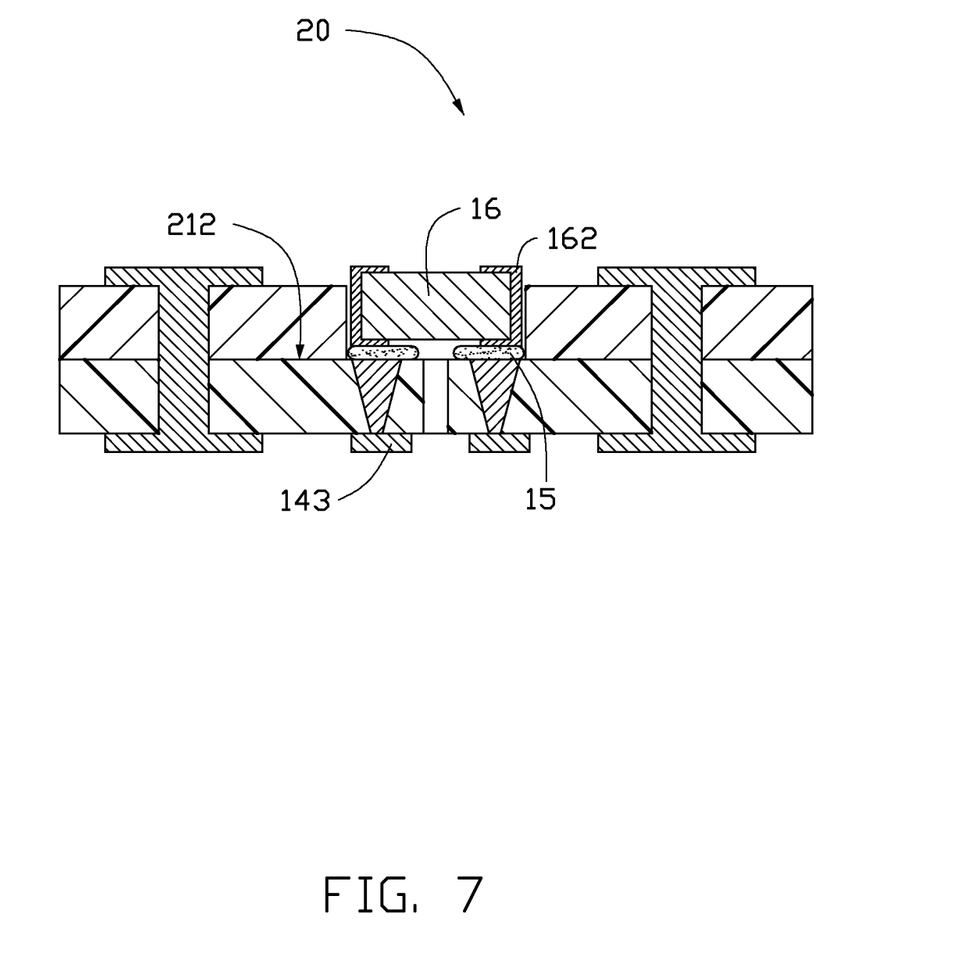
FIG. 7 shows a multilayer substrate obtained by arranging an electronic component on the structure of FIG. 4.

FIG. 7 shows that in step 3 a plurality of conductive pastes 15 are formed on the first surface 212. The conductive pastes 15 spatially correspond to the electrical contact pads 143. Each conductive paste 15 covers, and is electrically connected to an end of a conductive blind via 113 electrically connected to the corresponding electrical contact pad 143. A plurality of electronic components 16 is provided, and each electronic component 16 spatially corresponds with a pair of plated through holes 11. The electronic components 16 are electrically connected to the corresponding conductive paste 15, thereby obtaining a multilayer substrate 20.

In the present embodiment, the electronic components 16 may be passive elements or active elements, (e.g. chips, resistors, or capacitors) which include two electrodes 162. When the electronic component 16 is arranged on the conductive paste 15, the two electrodes 162 are respectively fixed and connected to the corresponding two conductive paste 15. In the present embodiment, a material of the conductive paste 15 may be a tin paste, a sliver paste, or a copper paste.

Figure 8:
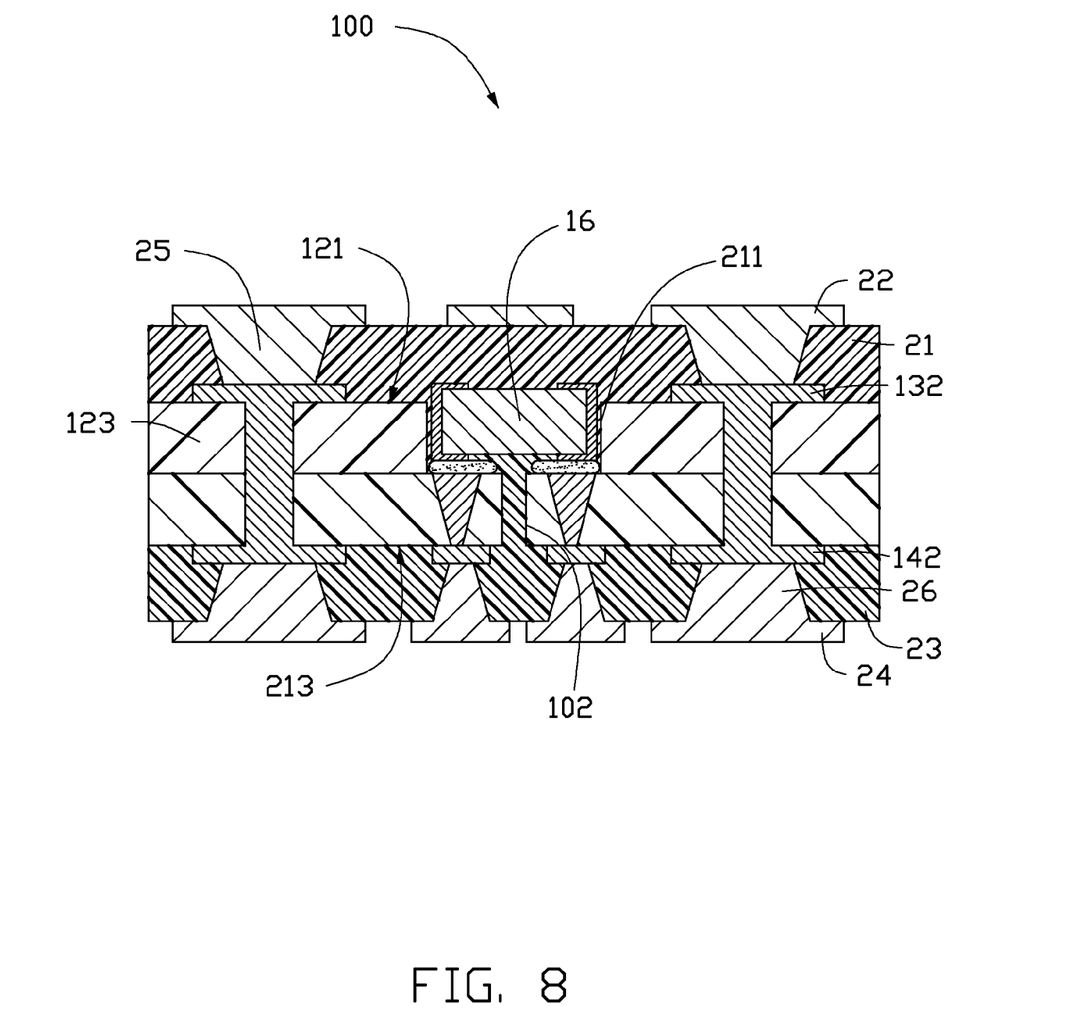
FIG. 8 shows a printed circuit board with embedded component obtained by forming an insulating layer and a wiring layers on the two opposite sides of the multilayer substrate of FIG. 5.

FIG. 8 shows that in step 4 a second insulating layer 21 and a third wiring layer 22 are formed at a side of the first wiring layer 132 of the multilayer substrate 20. In addition, a third insulating layer 23 and a fourth wiring layer 24 are formed at a side of the second wiring layer 142 of the multilayer substrate 20, thereby obtaining a printed wiring board 100 with embedded components.

The following steps may be used to form the second insulating layer 21, the third wiring layer 22, the third insulating layer 23, and the fourth wiring layer 24.

First, a third copper layer (not shown), the second insulating layer 21, the multilayer substrate 20, the third insulating layer 23, and a fourth copper layer (not shown) are stacked, and laminated onto each other to form a main body.

The second insulating layer 21 and the third insulating layer 23 usually are adhesive sheets, e.g. FR4 epoxy glass cloth half-cured adhesive sheets. After lamination, the second insulating layer 21 covers the first wiring layer 132, the upper surface 121 of the base layer 123, and the surfaces of the electronic components 16. In addition, fills into gaps between the electronic components 16 and the base layer 123. The third insulating layer 23 covers the second wiring layer 142 and the second surface 213 is exposed, then enters into sides of the electronic components 16 adjacent to the first surface 212 via the filling through hole 102, and fills into gaps between the electronic components 16 and the first surface 212. After the lamination is completed, the materials of the second insulating layer 21 and the third insulating layer 23 fill the filling through hole 102 and the gaps between the electronic components 16 and the first surface 212.

Second, a plurality of first conductive vias 25 are formed in the second insulating layer 21, a plurality of second conductive vias 26 are formed in the third insulating layer 23, and the third copper layer and the fourth copper layer are respectively converted into the third wiring layer 22 and the fourth wiring layer 24. The third wiring layer 22 is electrically connected to the first wiring layer 132 by the first conductive vias 25. The fourth wiring layer 24 is electrically connected to the second wiring layer 142 by the second conductive vias 26. The steps of forming the first conductive vias 25 and the second conductive vias 26 may be processed before the steps of forming the third wiring layer 22 and the fourth wiring layer 24. The first conductive vias 25 and the second conductive vias 26 may be formed by a laser boring process and a hole filling process. The hole filling process may be a plating process, or a copper filling process, or a silver filling process. The third wiring layer 22 and the fourth wiring layer 24 may be formed by an image transfer process and an etching process.

There may be two or more wiring layers formed at the side of the third wiring layer 32, and there may be two or more wiring layers formed at the side of the fourth wiring layer 24.

The printed circuit board 100 with embedded components includes the multilayer substrate 20, the second insulating layer 21, the third wiring layer 22, the third insulating layer 23, and the fourth wiring layer 24. The multilayer substrate 20 includes the substrate 12, the first wiring layer 132, the second wiring layer 142, and the electronic components 16. The substrate 12 is sandwiched between the first wiring layer 132 and the second wiring layer 142, and includes the base layer 123 and the first insulating layer 124. The base layer 123 has the upper surface 121, and the lower surface 122 opposite to the upper surface 121. The first wiring layer 132 is formed at the upper surface 121. The first wiring layer 132 and the base layer 123 have the opening 211.

The second insulating layer 21 comprises the first surface 212, and the second surface 213. The first surface 212 contacts with the lower surface 122, and a portion of the first surface 212 is exposed from the opening 211. The second wiring layer 142 is formed on the second surface 213. The second wiring layer 142 includes the electrical contact pads 143. The conductive blind vias 11 and the filling through hole 102 are formed in the base layer 123. Each electrical contact pad 143 is electrically connected to one conductive blind via 11. The ends of the conductive blind vias 11 adjacent to the first surface 212 are coplanar with or lower than the first surface 212. The filling through hole 102 passes through the second wiring layer 142 and the first insulating layer 124, and is located between the conductive blind vias 11. The ends of the filling through hole 102 and the conductive blind vias 11 adjacent to the first surface 212 are exposed from the opening 211. The printed circuit board 100 with embedded components further includes the conductive pastes 15 spatially corresponding to the electrical contact pads 143. Each conductive paste 15 contacts with, and is electrically connected to the end of the corresponding conductive blind via 11. The electronic component 16 is electrically connected to the conductive blind vias 11 by the conductive pastes 15, such that the electronic component 16 is electrically connected to the electrical contact pads 143. In the present embodiment, the electronic component 16 includes two electrodes 162, and there are two electrical contact pads 143, and two conductive pastes 15. Each electrode 162 is adhered to one conductive paste 15. The second insulating 21 is formed on the first wiring layer 132. The second insulating layer 21 covers the first wiring layer 132, the upper surface 121 is exposed, and the surface of the electronic component 16, and fills the gaps between the electronic components 16 and the base layer 121, thereby embedding the electronic components 16 into the second insulating layer 21. The third wiring layer 22 is formed on the surface of the second insulating layer 21 further away from the upper surface 121, and is electrically connected to the first wiring layer 132 by the first conductive vias 25. The third insulating layer 23 is formed on the second wiring layer 142, covering the second wiring layer 142, and exposing the second surface 213. The material enters into the sides of the electronic components 16 adjacent to the first surface 212 via the filling through hole 102, and fills into gaps between the electronic components 16 and the first surface 212. The material of the second insulating layer 21 and the third insulating layer 23 fills into the filling through hole 102 and the gaps between the electronic components 16 and the first surface 212. The fourth wiring layer 24 is formed on the surface of the third insulating layer 23 further away from the second surface 213.

It is understood that the number of the electronic components 16 may be more than or less than 3. In such case, the number of the conductive pastes 15, the number of the electrical contact pads 143, and the number of the conductive blind vias 11 should be changed to match with the number of the electronic components 16.

In the method for making the printed circuit board 100 with embedded components, the conductive blind vias 11 corresponding to the electronic components 16 are formed first, and then the conductive pastes 15 are formed on the ends of the conductive blind vias 11 to electrically connect the electronic components 16 to the multilayer substrate 20. Accordingly, avoiding an alignment between the electronic components 16 and the conductive blind vias 11. In addition, because there is no alignment, there is no need to use an expensive arrangement machine to arrange the electronic components 16 on the multilayer substrate 20. The cost of the printed circuit board 100 with embedded components is lowered.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A printed circuit board with an embedded component, comprising:
    a double-sided wiring board, the double-sided wiring board comprising a first wiring layer, a base layer, a first insulating layer, and a second wiring layer, which are stacked in described order, the first insulating layer having a first surface adjacent to the base layer, and a second surface facing away from the first surface, the base layer having an opening to make a portion of the second surface exposed to the outside, the second wiring layer comprising a plurality of electrical contact pads, a plurality of conductive blind vias being formed in the first insulating layer, each electrical contact pad spatially corresponding to one conductive blind via, and electrically connected to an end of the corresponding conductive blind via, the other ends of the conductive blind vias adjacent to the first surface and in the first insulating layer, a filling through hole being formed in the double-sided wiring board, which passes through the first insulating layer and the second wiring layer, and is between the conductive blind vias, the ends of the filling through hole and the conductive blind vias adjacent to the first surface being exposed to the outside from the opening;
    an electronic component and a plurality of conductive pastes, the conductive pastes respectively electrically connected to the conductive blind vias, and the electronic component being adhered to and electrically connected to the conductive pastes, and
    a second insulating layer and a third wiring layer successively arranged on the first wiring layer, and a third insulating layer and a fourth wiring layer successively arranged on the second wiring layer, the second insulating layer covering the electronic component, and filling a gap between the electronic component and the base layer in the opening, the third insulating layer covering the second wiring layer, the second insulating layer and the third insulating layer fully filling the filling through hole and the gaps between the electronic component and the base layer.

2. The printed circuit board of claim 1, wherein end surfaces of the conductive blind vias adjacent to the first surface are coplanar with or lower than the first surface.

3. The printed circuit board of claim 1, wherein the conductive paste is one of a tin paste, a sliver paste, and a copper paste.

4. A method for manufacturing a printed circuit board with an embedded component, comprising:
    providing a double-sided wiring board, the double-sided wiring board comprising a first wiring layer, a base layer, a first insulating layer, and a second wiring layer, which are stacked in described order, the first insulating layer having a first surface adjacent to the base layer, and a second surface facing away from the first surface, the base layer having an opening to allow a portion of the second surface to be exposed to the outside, the second wiring layer comprising a plurality of electrical contact pads, a plurality of conductive blind vias being formed in the first insulating layer, each electrical contact pad spatially corresponding to one conductive blind via, and electrically connected to an end of the corresponding conductive blind via, the other ends of the conductive blind vias adjacent to the first surface and in the first insulating layer, a filling through hole being formed in the double-sided wiring board, which passes through the first insulating layer and the second wiring layer, and is between the conductive blind vias, the ends of the filling through hole and the conductive blind vias adjacent to the first surface being exposed to the outside from the opening;

providing a plurality of conductive pastes, and electrically connecting each conductive paste to one of the conductive blind vias;

providing an electronic component, and arranging the electronic component on the conductive pastes to electrically connect the electronic component to the conductive pastes;

forming a second insulating layer and a third wiring layer at a side of the first wiring layer in described order, and forming a third insulating layer and a fourth wiring layer at a side of the second wiring layer in described order, such that the second insulating layer covers the electronic component, and fills a gap between the electronic component and the base layer in the opening, the third insulating layer covers the second wiring layer, the second insulating layer and the third insulating layer fully filling the filling through hole and the gaps between the electronic component and the base layer, thereby obtaining a printed circuit board with a embedded component.

5. The method of claim 4, wherein end surfaces of the conductive blind vias adjacent to the first surface are coplanar with or lower than the first surface.

6. The method of claim 4, wherein a method for making the double-sided wiring board comprising:

stacking a single-sided copper-clad laminate having the base layer and a first copper layer formed on the base layer, the first insulating layer, and a second copper layer in described order, the base layer being sandwiched between the first copper layer and the first insulating layer, the second copper layer being at a side of the first insulating layer further away from the base layer, the opening formed at the single-sided copper-clad laminate, and passing through the first copper layer and the first insulating layer;

forming the filling through hole passing through the first insulating layer and the second copper layer in the opening, and forming a plurality of blind vias only passing through the first insulating layer in the opening to form the conductive blind vias;

forming a conductive material in each blind via to convert the blind via to be the conductive blind via, and converting the first copper layer to the first wiring layer, and converting the second copper layer to the second wiring layer, thereby obtaining the double-sided wiring board.

7. The method of claim 6, wherein a process of forming the conductive material in each blind via is an electroplating process.

8. The method of claim 4, wherein the conductive paste is one of a tin paste, a sliver paste, and a copper paste.

* * * * *